(12) United States Patent
Harada

(10) Patent No.: US 7,955,878 B2
(45) Date of Patent: Jun. 7, 2011

(54) SEMICONDUCTOR LIGHT EMITTING DEVICE AND METHOD OF MANUFACTURING THE SAME

(75) Inventor: Mitsunori Harada, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 12/643,871

(22) Filed: Dec. 21, 2009

(65) Prior Publication Data
US 2010/0099208 A1     Apr. 22, 2010

Related U.S. Application Data

(62) Division of application No. 11/093,039, filed on Mar. 30, 2005, now Pat. No. 7,635,873.

(30) Foreign Application Priority Data

Mar. 31, 2004   (JP) .................................. 2004-106643

(51) Int. Cl.
*H01L 21/00* (2006.01)
(52) U.S. Cl. ................. 438/27; 438/29; 257/95; 257/98; 257/99; 257/100; 257/E33.061
(58) Field of Classification Search ..................... 257/95, 257/98, 99, 100, E33.061; 438/27, 29
See application file for complete search history.

(56) References Cited

U.S. PATENT DOCUMENTS

| | | | |
|---|---|---|---|
| 5,959,316 A | 9/1999 | Lowery | |
| 6,066,861 A | 5/2000 | Hohn et al. | |
| 6,245,259 B1 | 6/2001 | Hohn et al. | |
| 6,277,301 B1 | 8/2001 | Hohn et al. | |
| 6,340,824 B1 | 1/2002 | Komoto et al. | |
| 6,576,930 B2 | 6/2003 | Reeh et al. | |
| 6,592,780 B2 | 7/2003 | Hohn et al. | |
| 6,613,247 B1 | 9/2003 | Hohn et al. | |
| 6,653,661 B2 | 11/2003 | Okazaki | |
| 6,669,866 B1 | 12/2003 | Kummer et al. | |
| 6,774,401 B2 | 8/2004 | Nakada et al. | |
| 6,809,342 B2 | 10/2004 | Harada | |
| 6,812,500 B2 | 11/2004 | Reeh et al. | |
| 6,924,514 B2 | 8/2005 | Suenaga | |
| 7,075,116 B2 | 7/2006 | Okazaki | |

(Continued)

FOREIGN PATENT DOCUMENTS

| | | |
|---|---|---|
| JP | 10-190065 A | 7/1998 |
| JP | 2000-228544 A | 8/2000 |
| JP | 2001-127346 A | 5/2001 |
| JP | 2001-196639 A | 7/2001 |
| JP | 2001-210872 A | 8/2001 |
| JP | 2001-345483 A | 12/2001 |
| JP | 2001-151743 A | 5/2002 |

(Continued)

OTHER PUBLICATIONS

Nov. 27, 2007 Office Action issued by Japan Patent Office in related Japanese patent application.

*Primary Examiner* — Wael M Fahmy
*Assistant Examiner* — John C Ingham
(74) *Attorney, Agent, or Firm* — Kenealy Vaidya LLP

(57) ABSTRACT

A semiconductor light emitting device can include a casing having a concave-shaped cavity with an opening, a semiconductor light emitting element installed in a bottom portion of the cavity, and a resin layer for filling an interior of the cavity. The resin layer can include a wavelength conversion material, and can be formed in a convex shape in a light radiation direction of the light emitting element. In the resin layer a layer with a high density of the wavelength conversion material can be formed near a surface of the convex shape.

3 Claims, 4 Drawing Sheets

U.S. PATENT DOCUMENTS

| | | |
|---|---|---|
| 2001/0000622 A1 | 5/2001 | Reeh et al. |
| 2003/0214233 A1 | 11/2003 | Takahashi et al. |
| 2003/0230751 A1 | 12/2003 | Harada |
| 2004/0041222 A1 | 3/2004 | Loh |

FOREIGN PATENT DOCUMENTS

| | | |
|---|---|---|
| JP | 2003-46133 A | 2/2003 |
| JP | 2003-234511 A | 8/2003 |
| JP | 2003-318448 A | 11/2003 |
| JP | 2004-056075 A | 2/2004 |

Fig. 1  Related Art
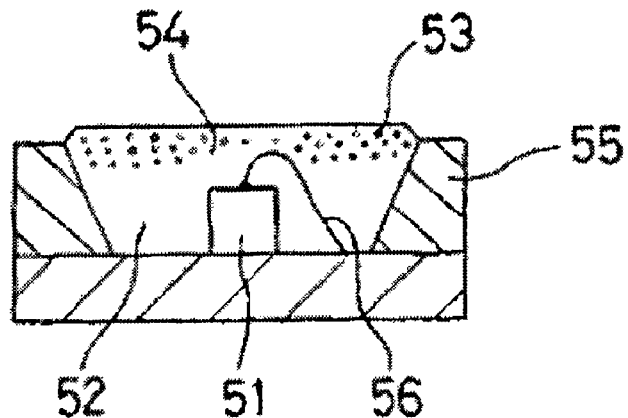
Fig. 2  Related Art
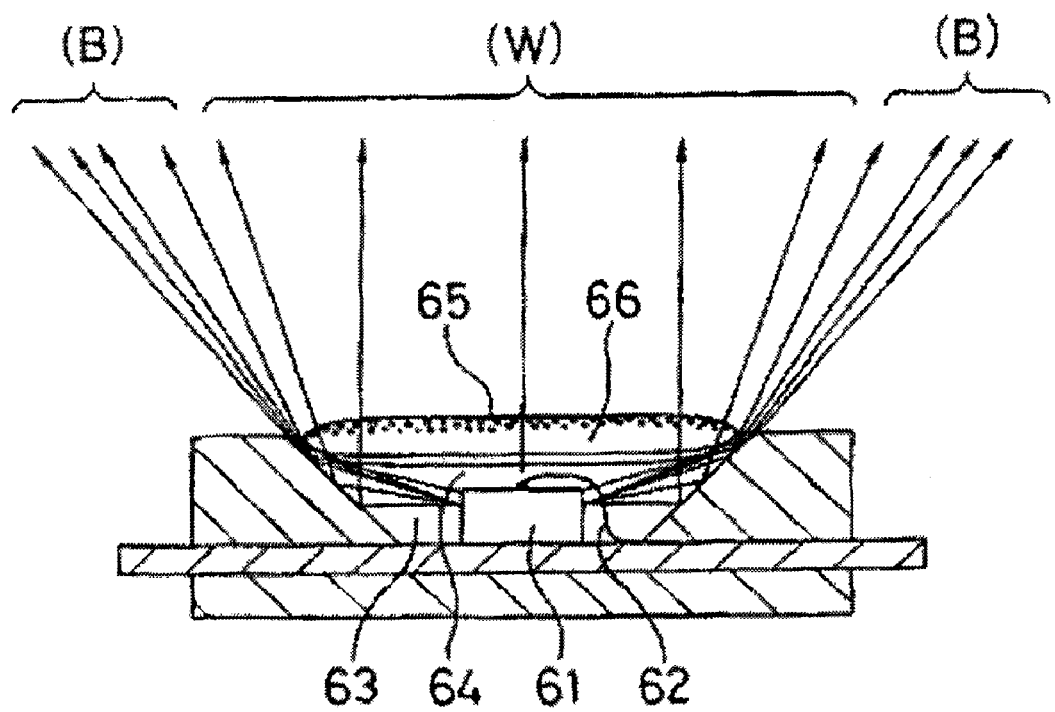

SEMICONDUCTOR LIGHT EMITTING DEVICE AND METHOD OF MANUFACTURING THE SAME

This application is a divisional application, and claims the priority benefit under 35 U.S.C. §120 of U.S. patent application Ser. No. 11/093,039 filed Mar. 30, 2005, now U.S. Pat. No. 7,635,873, which is hereby incorporated by reference. This application also claims the priority benefit under 35 U.S.C. §119 of Japanese Patent Application No. 2004-106643 filed on Mar. 31, 2004, which is hereby incorporated by reference.

BACKGROUND

1. Field

The disclosed subject matter relates to a semiconductor light emitting device and a method of manufacturing such a device. More specifically, it relates to a semiconductor light emitting device that emits light of an arbitrary color, by using additive color mixing to combine the light emitted from a semiconductor light emitting element with the wavelength converted light emitted from a phosphor that has been excited by the light from the semiconductor light emitting element, as well as a method of manufacturing such a device.

2. Description of the Related Art

Producing a white light emitting device using a light emitting diode (LED) chip that emits light with a sharp spectral distribution as the light source can be achieved by employing additive color mixing of the light emitted from the LED chip, and wavelength converted light emitted from a phosphor that has been excited by the light emitted from the LED chip.

For example, if the light emitted from the LED chip is blue light, then a phosphor is used that is excited by blue light and causes a wavelength conversion to yellow light, which is the complementary color of blue. Additive color mixing of the blue light emitted from the LED chip with the wavelength converted yellow light emitted from the phosphor, which has undergone excitation under the irradiation of the blue light from the LED chip, enables the production of a white light.

Alternatively, if the light emitted from the LED chip is blue light, then a mixture of two phosphors that are excited by blue light and cause wavelength conversions to green light and red light respectively can also be used. In this case, additive color mixing of the blue light emitted from the LED chip, and the wavelength converted green light and red light emitted from the two phosphors, which have undergone excitation under the irradiation of the blue light from the LED chip, enables the production of a white light.

Furthermore, if the light emitted from the LED chip is ultraviolet light, then a mixture of three phosphors that are excited by ultraviolet light and cause wavelength conversions to blue light, green light, and red light respectively can be used. In this case, additive color mixing of the wavelength converted blue light, green light, and red light emitted from the three phosphors, which have undergone excitation under the irradiation of the ultraviolet light from the LED chip, enables the production of a white light.

In addition, light of colors other than white can also be obtained by suitable combinations of colored light emitted from an LED chip, and a phosphor that functions as a wavelength conversion material.

FIG. 1 shows an example of a related art light emitting device in which the light emitted from the light source excites a phosphor and causes a wavelength conversion, resulting in the emission of light of a different color from that of the light source (see Japanese Patent Laid-open Publication No. 2002-151743). In this example, a cup (concave portion) 52 for housing a light emitting element (LED chip) 51 is formed in the middle of a casing 55 that incorporates a substrate. The light emitting element 51 is positioned in the bottom portion of the cup 52 of the casing 55, and is electrically connected via bonding wire 56. The cup 52 is filled with a resin 54, which contains a dispersed phosphor 53 that functions as a wavelength conversion material. A lid is then placed across the top surface (the open portion of the cup 52) of the casing 55, and the casing is inverted, so that the phosphor 53, which has a larger specific gravity than the resin 54, sinks through the resin and accumulates near the open portion of the cup 52. With the phosphor 53 in this state of uneven distribution near the open portion, the resin 54 is heat cured, thereby yielding a light emitting device in which the density of the phosphor 53 is higher near the open portion of the cup 52 than in the lower portion.

Related art light emitting devices such as that shown in FIG. 2 have also been proposed as alternative means for use as a lighting device (for example, see Japanese Patent Laid-open Publication No. 2003-234511). In this example, a cup 63 of a similar structure to that described above is filled with a first light transmitting resin 64 to a level equivalent to between 60 and 70% of the cup capacity, and this first resin is then heat cured. Subsequently, a second light transmitting resin 66, which contains a dispersed phosphor 65 that functions as a wavelength conversion material, is then injected on top of the first resin, in a quantity equivalent to between 50 and 60% of the cup capacity. The cup is then inverted and heat cured, so that the second light transmitting resin 66 bulges out in a convex shape around the outer edges of the cup 63, while the phosphor 65 dispersed within the second light transmitting resin 66 sinks through the resin and accumulates near the convex bulge at the cup opening. As a result, a light emitting device is formed in which the phosphor 65 is distributed at high density near the convex-shaped surface of the resin.

In the former of the conventional light emitting devices described above, when the lid is placed across the top surface of the casing, and the resin inside the cup is heat cured with the casing inverted, the top surface of the casing and the lid should contact with no gaps around the entire top surface. If even a small gap exists, then the resin may leak out of the cup through that gap, resulting in a defective product.

Particularly, when a plurality of cups are formed within a large casing to enable large volume batch production, ensuring the high level of surface precision necessary to ensure a tight contact between the top surface of the cups and the lid is extremely difficult. Furthermore, the heat of the resin heat curing process can cause deformations such as expansion or warping of the casing and/or the lid, thereby destroying the contact between the two members, and deterioration in the production yield is thus unavoidable. Even if prevention of such problems were possible, the associated costs would be considerable.

In addition, in order to increase the quantity of light emitted, the size of the light emitting element can be increased, and a larger current can be passed through the element, but there are practical limits to the size of the package. This means the size of the cup in which the light emitting element is located is also limited, which causes an increase in the proportion of the internal capacity of the cup occupied by the light emitting element, when compared with conventionally sized light emitting devices of a similar type. In other words, there is a reduction in the free capacity within the cup, calculated by subtracting the volume of the light emitting element from the total internal capacity of the cup.

As a result, both the distance between the side surfaces of the light emitting element and the inner peripheral surface of the cup, and the distance between the upper surface of the light emitting element and the top surface of the resin used to fill the cup are reduced. This means that the quantity of resin that exists between the upper surface of the light emitting element and the top surface of the resin is significantly less than the quantity of resin that exists between the side surfaces of the light emitting element and the inner peripheral surface of the cup. This can also be said of the quantity of phosphor dispersed within the resin prior to curing.

If a lid is placed across the top surface of this type of casing, and the casing is then inverted and the resin subjected to heat curing, then as described above, the quantity of phosphor present in the resin between the upper surface of the light emitting element and the top surface of the resin is significantly less than the quantity of phosphor present in the resin between the side surfaces of the light emitting element and the inner peripheral surface of the cup. Consequently, the quantity of phosphor that sinks into the region positioned above the light emitting element is less than the quantity that sinks into the surrounding region, meaning formation of a uniform phosphor layer is difficult.

As a result, the light emitted from the light emitting element causes the excitation of varying quantities (densities) of the phosphor depending on where it reaches the high density phosphor layer, meaning the light emission displays considerable color irregularity. Color irregularity is governed by strict regulations (specifications), particularly for white light LEDs, meaning the above problem causes a significant reduction in the yield of product.

In contrast, in the latter of the conventional light emitting devices described above, surface tension causes the first light transmitting resin to climb up the outside edges of the cup. The second light transmitting resin with the phosphor dispersed therein is then used to form a convex lens-shaped layer on top of this first resin, so that a high density phosphor layer is provided near the surface of this convex lens-shaped bulge. During the formation of this layer, the quantity of phosphor near the edges of the second light transmitting layer is significantly less than that within the central bulge portion. Furthermore, the second light transmitting resin may have trouble reaching the top of the first light transmitting resin around the outside edges of the cup, meaning a phosphor layer may not form at these outside edges.

In the ideal situation, a light emitting device should be constructed so that additive color mixing of the light emitted from the light emitting element with the light that has been emitted from the light emitting element and which has then undergone wavelength conversion within the phosphor layer, generates a white light with minimal color irregularity in substantially all directions. However, if light does not pass through the phosphor layer within some regions, but is rather emitted directly from the light emitting element, then within those regions, the emitted light is not a product of additive color mixing, but is solely the light emitted from the light emitting element having its original color.

In such a case, if the light emitted from the light emitting element is blue light with a peak wavelength of approximately 450 to 470 nm, then light which is emitted from the light emitting element and which passes through a region in which the phosphor layer exists is radiated from the light emitting device as white light (W). In contrast, light which is emitted from the light emitting element and passes through a region in which the phosphor layer does not exist is radiated from the light emitting device as blue light (B). This means the white LED product actually emits a mixture of both white and blue light, which is undesirable.

Furthermore, suppose the light emitted from the light emitting element is from the short wavelength region with a peak wavelength of no more than 400 nm. Then, if this ultraviolet light is radiated directly from the light emitting device, and if it enters a person's eyes directly, it may present potential dangers.

SUMMARY

The disclosed subject matter takes the above and other problems into consideration to provide a semiconductor light emitting device that displays minimal color irregularity and brightness fluctuation, and actively suppresses the radiation of light that is potentially harmful to humans, as well as a method of manufacturing such a device.

According to a first aspect of the disclosed subject matter, a semiconductor light emitting device can include a casing having a concave-shaped cavity with an opening; a semiconductor light emitting element installed in a bottom portion of the cavity; and a resin layer for filling an interior of the cavity, the resin layer containing a wavelength conversion material, the resin layer being formed in a convex shape in a light radiation direction of the light emitting element, in the resin layer a layer with a high density of the wavelength conversion material being formed near a surface of the convex shape.

According to a second aspect of the disclosed subject matter, a method of manufacturing a semiconductor light emitting device can include preparing a casing having a concave-shaped cavity with an opening; installing a semiconductor light emitting element in a bottom portion of the cavity; filling an interior of the cavity with a light transmitting resin containing a wavelength conversion material to form the resin into a convex shape in a light radiation direction of the light emitting element; inverting the casing, so that self-weight causes the wavelength conversion material to separate into a high density portion and a low density portion within the resin; and curing the light transmitting resin in a state the wavelength conversion material exists as the high and low density portions.

In the semiconductor light emitting device according to the first aspect, the casing may form the cavity with a truncated cone-shaped inner peripheral surface that opens outward along the light radiation direction of the light emitting element. The inner peripheral surface may function as a reflective surface.

Alternatively, in the semiconductor light emitting device according to the first aspect, the casing may form the cavity with a truncated cone-shaped inner peripheral surface that opens outward along the light radiation direction of the light emitting element, and a circular cylindrically shaped inner peripheral surface that is a continuous extension of the truncated cone-shaped inner peripheral surface. At least one of the truncated cone-shaped inner peripheral surface and the circular cylindrically shaped inner peripheral surface may function as a reflective surface.

A layer with a high density of the wavelength conversion material may be formed with a substantially uniform thickness across the entire surface of the resin.

In accordance with another aspect of the disclosed subject matter, a semiconductor light emitting device can include a casing having a concave-shaped cavity with an opening and a bottom portion and a semiconductor light emitting element located in the cavity and having a light radiation direction. A resin portion can be located adjacent the cavity and form a substantially convex surface adjacent the opening of the casing. The resin portion can include a layer containing a wavelength conversion material substantially uniformly dispersed therein, the layer having a central portion and a peripheral portion that is in contact with the casing. The layer can have a thickness at the central portion and a thickness at the peripheral portion that are substantially equal to each other.

As described above, the semiconductor light emitting device can display minimal color irregularity and brightness fluctuation, and can actively suppress the radiation of light that is potentially harmful to humans. These attributes can be achieved, for example, by sealing the semiconductor light emitting device with a bulging, convex-shaped portion of a light transmitting resin containing a dispersed wavelength conversion material, and forming a high density layer of the wavelength conversion material near the surface of the resin, which covers the entire surface, and is of substantially uniform density and substantially uniform thickness.

BRIEF DESCRIPTION OF THE DRAWINGS

These and other features and advantages of the disclosed subject matter will become clear from the following description with reference to the accompanying drawings, wherein:

FIG. 1 is a cross-sectional view showing a conventional example;

FIG. 2 is a cross-sectional view showing another conventional example;

DETAILED DESCRIPTION

The following is a detailed description of exemplary embodiments of the disclosed subject matter, with reference to FIG. 3A through FIG. 3E, FIG. 4, and FIG. 5A through FIG. 5E. In these figures, identical members are labeled using the same symbols, and in some cases, descriptions of these common members are omitted. Although the following embodiments are exemplary of the disclosed subject matter, the disclosed subject matter is in no way limited to the embodiments presented below.

Exemplary Embodiment of FIGS. 3A-3E

Figure 3A:
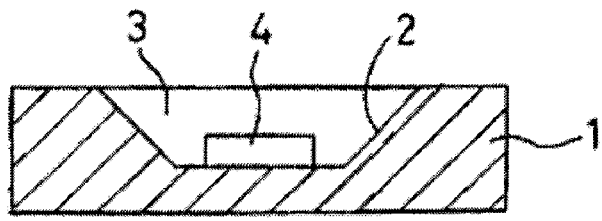
FIG. 3A through FIG. 3E are process diagrams showing an exemplary embodiment of a method of manufacturing a semiconductor light emitting device that is made in accordance with the principles of the disclosed subject matter.

FIG. 3A through FIG. 3E are process diagrams showing an exemplary embodiment of a method of manufacturing a semiconductor light emitting device made in accordance with the principles of the disclosed subject matter. First, as shown in FIG. 3A, a cavity 3 can be formed in a casing 1 produced from an opaque resin with a high reflectance, and the inner peripheral surface of this cavity 3 can function as a reflective surface 2. A semiconductor light emitting element 4 can be disposed within the flat bottom portion of this cavity 3.

In this description, the cavity 3 may have a mortar-shaped inner peripheral surface (truncated cone-shaped inner peripheral surface). The disclosed subject matter is not limited thereto, and according to various exemplary embodiments of the disclosed subject matter, the cavity 3 may have a partly cylindrical inner peripheral surface with a truncated cone-shaped surface, among other shapes, which will be described later. Furthermore, the inner peripheral surface may have a groove partly in order to control the reflection, the distribution of the wavelength conversion material, and the like.

In order to enable the semiconductor light emitting element 4 to emit light, a forward voltage should be applied between the anode and cathode electrodes of the semiconductor light emitting element 4. Accordingly, connection means (not shown in the figures) should be provided for electrically connecting the anode and cathode electrodes of the semiconductor light emitting element 4 with externally located terminal electrodes that are connected to a power source.

Figure 3B:
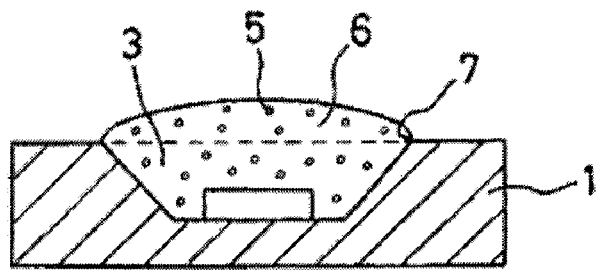

Subsequently, as shown in FIG. 3B, a dispersed phosphor-containing resin 6 can be used to overfill the cavity 3, so that the resin bulges up in a convex shape from the upper edge 7 of the cavity 3. The dispersed phosphor-containing resin 6 can be prepared by dispersing a phosphor 5 that functions as a wavelength conversion material within a light transmitting resin. The degree to which the dispersed phosphor-containing resin 6 bulges up from the upper edge 7 of the cavity 3 can be set in accordance with factors such as the degree of adhesion between the dispersed phosphor-containing resin 6 and the upper edge 7 of the cavity 3, and the viscosity and surface tension of the dispersed phosphor-containing resin 6, and should be set so that the dispersed phosphor-containing resin 6 does not leak out beyond the cavity 3.

Figure 3C:
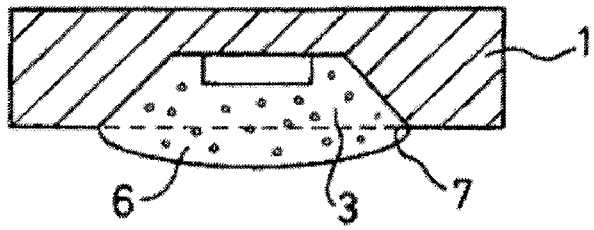

Next, as shown in FIG. 3C, the casing 1 is inverted, and the dispersed phosphor-containing resin 6 inside the cavity 3 can be heat cured. The adhesion between the dispersed phosphor-containing resin 6 and the upper edge 7 of the cavity 3, and the viscosity and surface tension of the dispersed phosphor-containing resin 6 counteract the gravity acting on the dispersed phosphor-containing resin 6 when the casing 1 is inverted, meaning the dispersed phosphor-containing resin 6 is prevented from leaking from the cavity 3. Accordingly, a lid may not be required to prevent leakage of the dispersed phosphor-containing resin 6.

Figure 3D:
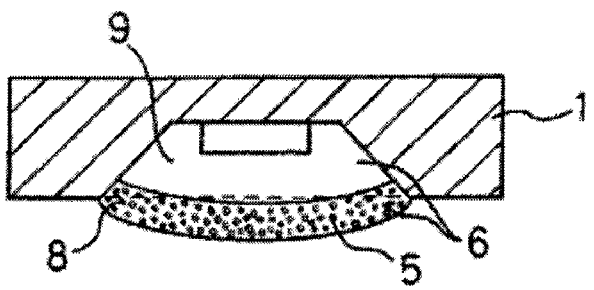

During this step of curing the dispersed phosphor-containing resin 6 inside the cavity 3 with the casing 1 in an inverted state, the phosphor 5 undergoes a migration, as shown in FIG. 3D. Namely, the difference in specific gravity between the light transmitting resin and the phosphor 5 that make up the dispersed phosphor-containing resin 6 causes the heavier phosphor 5 to sink through the light transmitting resin. As a result, the phosphor 5 accumulates near the surface of the dispersed phosphor-containing resin 6, thereby generating a high density phosphor layer 8, in which the density of the phosphor 5 is very high, and a low density phosphor layer 9, in which the density of the phosphor 5 is very low, relatively, or can be essentially non-existent.

Figure 3E:
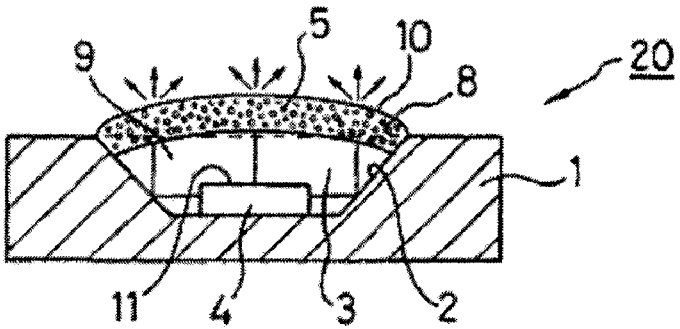

By conducting curing in this state, a semiconductor light emitting device 20 shown in FIG. 3E can be formed.

As follows is a description of the optical system of the semiconductor light emitting device 20 of this example. A portion of the light that is emitted from the semiconductor light emitting element 4 and that travels through the low density phosphor layer 9 and reaches the high density phosphor layer 8 directly can be simply radiated out through a light exit surface 10 of the high density phosphor layer 8. The remaining portion of light can undergo wavelength conversion through the action of the phosphor 5 in the high density phosphor layer 8, before being radiated out through the light exit surface 10 of the high density phosphor layer 8.

Furthermore, light that is emitted from the semiconductor light emitting element 4 and travels towards the reflective surface 2 of the cavity 3 passes through the low density phosphor layer 9 until it reaches the reflective surface 2, and is then reflected by the reflective surface 2 towards the high density phosphor layer 8. The light then passes through the low density phosphor layer 9 again, until it reaches the high density phosphor layer 8. In the same manner as described above, a portion of this light reaching the high density phosphor layer 8 is simply radiated out through the light exit surface 10 of the high density phosphor layer 8, whereas the remaining portion undergoes wavelength conversion through the action of the phosphor 5 in the high density phosphor layer 8, before being radiated out through the light exit surface 10 of the high density phosphor layer 8.

Because the light radiated from the semiconductor light emitting element 4 follows two separate optical paths, the amount of light emitted from the semiconductor light emitting element 4 is the aggregate of the amount of light following each of these two optical paths. This results in a bright semiconductor light emitting device with a high level of light extraction efficiency.

Furthermore, the light radiated from the light exit surface 10 of the high density phosphor layer 8 can also be a combination of light emitted by the semiconductor light emitting element 4, and light that has been emitted by the semiconductor light emitting element 4 and which has then undergone wavelength conversion by the phosphor 5. Visually, the light is seen as the color generated by additive color mixing of these two types of light.

The high density phosphor layer 8 formed near the surface of the dispersed phosphor-containing resin 6 can be formed by the heavier phosphor 5 sinking through the resin during inversion of the casing 1. This high density phosphor layer 8 can be formed with a substantially uniform thickness across the entire surface of the resin. Accordingly, the optical path length from the point of entering the high density phosphor layer 8, until reaching the light exit surface 10 of the high density phosphor layer 8, can be substantially equal across the entire surface. This means that the percentage ratio of light entering the high density phosphor layer 8 that will undergo wavelength conversion by the phosphor 5 can be substantially equal regardless of radiation direction. Namely, the incident light at a certain ratio can be equally subjected to the wavelength conversion by the phosphor layer 8 at any location where the light enters. This enables the production of a semiconductor light emitting device in which the problems of color irregularity and brightness fluctuation can be significantly reduced and the quality of the lamp can be significantly improved.

Furthermore, because the high density phosphor layer 8 that forms the light exit surface 10 through which the light is externally radiated can be formed with a three dimensional convex shape, the color and brightness of the light can be almost independent of the radiation direction.

In addition, the low density phosphor layer 9 that forms the interface with a light exit surface 11 of the semiconductor light emitting element 4 can be formed from a light transmitting resin that contains either a relatively low density of the phosphor 5 or almost no phosphor 5. This light transmitting resin can be a material with a similar refractive index to the semiconductor material of the light exit surface 11 of the semiconductor light emitting element 4. This enables the proportion of light that is emitted from the semiconductor light emitting element 4 and which then undergoes total reflection back inside the semiconductor light emitting element 4 at the light exit surface 11 to be minimized. As a result, the vast majority of light passes from the light exit surface 11 of the semiconductor light emitting element 4 into the low density phosphor layer 9, meaning the light extraction efficiency from the semiconductor light emitting element 4 can be maximized.

Figure 4:
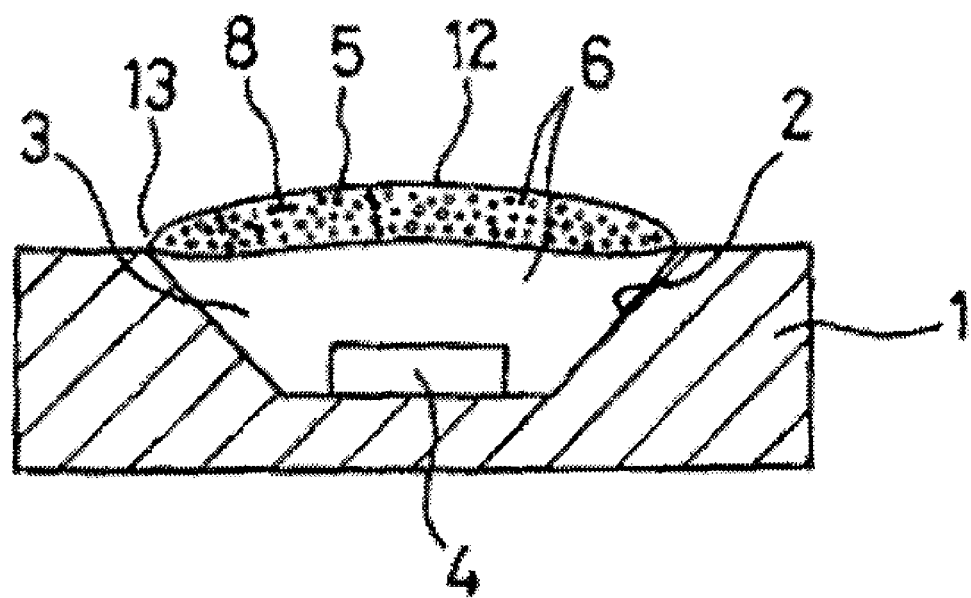
FIG. 4 is a cross-sectional view showing a sample product produced using the method described with respect to FIGS. 3A-E.

FIG. 4 shows a semiconductor light emitting device produced using a dispersed phosphor-containing resin that displays a very large reduction in viscosity during heat curing. In this case, the cavity 3 is overfilled with the dispersed phosphor-containing resin 6, so that the resin bulges up in a convex shape above the upper surface of the cavity 3. The casing 1 is then inverted, and the dispersed phosphor-containing resin 6 forms a downward facing convex bulge.

When the dispersed phosphor-containing resin 6 is heated in this inverted state, the viscosity of the resin decreases. At this time, the phosphor 5 within the dispersed phosphor-containing resin 6 sinks down through the resin 6 to the lower portions of the convex bulge, and because of the low viscosity of the resin, the phosphor 5 near the inner peripheral surface of the cavity 3 slides down along the inclined reflective surface. As a result, the high density phosphor layer 8 containing the accumulated phosphor 5 tends to be thinner within the peripheral portion 13 than within the central portion 12, which can cause the light emitting device to display increased levels of color irregularity and brightness fluctuation.

FIG. 5A through FIG. 5E shows a semiconductor light emitting device of a structure capable of overcoming the above problem when a dispersed phosphor-containing resin that displays a very large reduction in viscosity during heat curing is used. This device is described below as another exemplary embodiment.

Exemplary Embodiment of FIGS. 5A-E

FIG. 5A through FIG. 5E are process diagrams showing another exemplary embodiment of a method of manufacturing a semiconductor light emitting device made in accordance with the principles of the disclosed subject matter. The manufacturing steps for the semiconductor light emitting device of the exemplary embodiment of FIGS. 5A-E can be similar to those described above for the exemplary embodiment of FIGS. 3A-E, with the exception that the cavity formed in the casing 1 can include two separate portions.

Figure 5A:
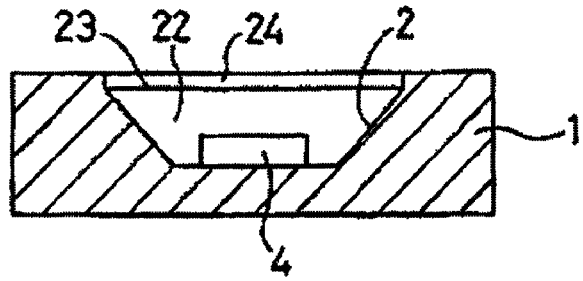
FIG. 5A through FIG. 5E are process diagrams showing another exemplary embodiment of a method of manufacturing a semiconductor light emitting device made in accordance with the principles of the disclosed subject matter.

The following is a description of the manufacturing steps of the exemplary embodiment of FIGS. 5A-E, including sections that overlap with the content described above in relation to the exemplary embodiment of FIGS. 3A-E. First, as shown in FIG. 5A, a mortar-shaped first cavity 22 and a second cavity 24 can be formed in a casing 1 that is produced from an opaque resin with a high reflectance. The first cavity 22 can include an inner peripheral surface that functions as a reflective surface 2. The second cavity 24 can be positioned above the first cavity 22 and contain a common virtual surface 23 with the first cavity 22 along with an inner peripheral surface that is substantially vertical.

A semiconductor light emitting element 4 can be installed within the bottom portion of the first cavity 22. In a similar manner to the exemplary embodiment of FIGS. 3A-E, the semiconductor light emitting element 4 can be connected to a circuit such as a power source (not shown in the figures) via electrical connection means that connects the element electrodes (not shown in the figures) to external connection terminals (which are also not shown in the figures).

Figure 5B:
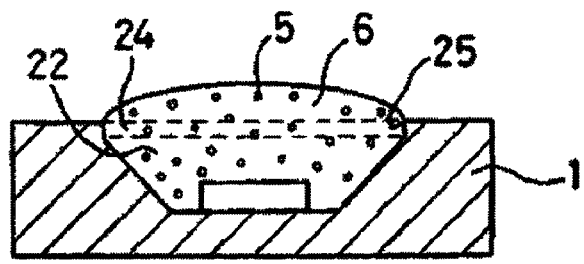

Subsequently, as shown in FIG. 5B, a dispersed phosphor-containing resin 6 that includes a phosphor 5 dispersed within a light transmitting resin, can be used to overfill the first and second cavities 22 and 24, so that the resin bulges up in a convex shape from the upper edge 25 of the second cavity 24. The degree to which the dispersed phosphor-containing resin 6 bulges up from the upper edge 25 of the second cavity 24 can be set in accordance with factors such as the degree of adhesion between the dispersed phosphor-containing resin 6 and the upper edge 25 of the second cavity 24, and the viscosity and surface tension of the dispersed phosphor-containing resin 6, and can be set so that the dispersed phosphor-containing resin 6 does not leak out beyond the first or second cavities 22 and 24.

Figure 5C:
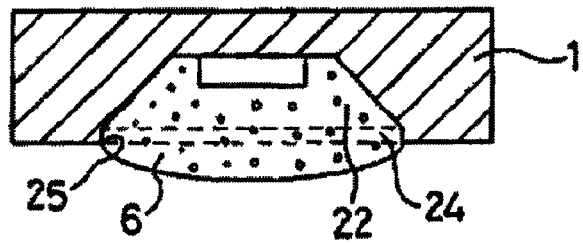

Next, as shown in FIG. 5C, the casing 1 is inverted, and the dispersed phosphor-containing resin 6 inside the first and second cavities 22 and 24 can be heat cured. The adhesion between the dispersed phosphor-containing resin 6 and the upper edge 25 of the second cavity 24 and the viscosity and surface tension of the dispersed phosphor-containing resin 6 counteract the gravity acting on the dispersed phosphor-containing resin 6 when the casing 1 is inverted. Thus substantially or totally preventing the dispersed phosphor-containing resin 6 from leaking from the first and second cavities 22 and 24. Accordingly, a lid may not be required to prevent leakage of the dispersed phosphor-containing resin 6.

Figure 5D:
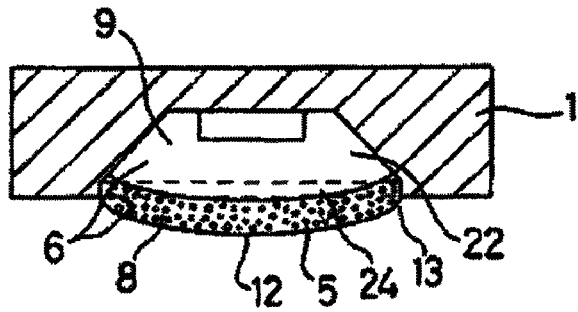

During this step of curing the dispersed phosphor-containing resin 6 inside the first and second cavities 22 and 24 with the casing 1 in an inverted state, the phosphor 5 undergoes a migration, as shown in FIG. 5D. Namely, the difference in specific gravity between the light transmitting resin and the phosphor 5 that make up the dispersed phosphor-containing resin 6 causes the heavier phosphor 5 to sink through the light transmitting resin. As a result, the phosphor 5 accumulates near the surface of the dispersed phosphor-containing resin 6, thereby generating a high density phosphor layer 8, in which the density of the phosphor 5 is very high, and a low density phosphor layer 9, in which the density of the phosphor 5 is relatively very low or can be essentially non-existent.

At this time, as the dispersed phosphor-containing resin 6 is heated, the resin shifts to a state of extremely low viscosity. As a result, the phosphor 5 within the dispersed phosphor-containing resin 6 sinks down through the resin 6 to the lower portions of the convex bulge. However, because the second cavity 24 is formed with a substantially vertical inner peripheral surface, the phosphor 5 within the peripheral portion 13 of the high density phosphor layer 8 accumulates along this substantially vertical inner peripheral surface of the second cavity 24. As a result, the high density phosphor layer 8 can be formed with a substantially uniform thickness across both the peripheral portion 13 and the central portion 12.

Figure 5E:
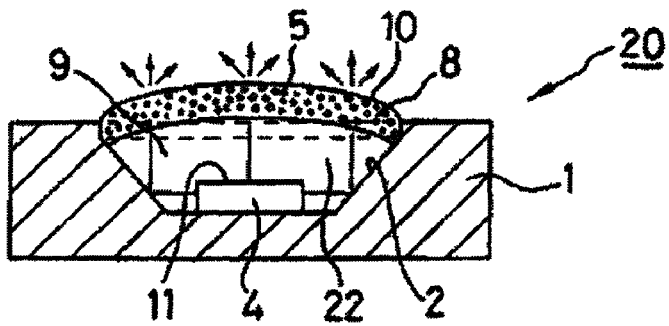

The method described in relation to FIGS. 5A-E enables the production of a semiconductor light emitting device 20 shown in FIG. 5E.

The following is a description of the optical system of the semiconductor light emitting device 20 of this example. A portion of the light that is emitted from the semiconductor light emitting element 4 and that travels through the low density phosphor layer 9 and directly reaches the high density phosphor layer 8 can be simply radiated out through the light exit surface 10 of the high density phosphor layer 8. The remaining portion of light can undergo wavelength conversion through the action of the phosphor 5 in the high density phosphor layer 8 before being radiated out through the light exit surface 10 of the high density phosphor layer 8.

Furthermore, light that is emitted from the semiconductor light emitting element 4 and travels towards the reflective surface 2 of the first cavity 22 can pass through the low density phosphor layer 9 until it reaches the reflective surface 2, and can then be reflected by the reflective surface 2 towards the high density phosphor layer 8. The light can then pass through the low density phosphor layer 9 again, until it reaches the high density phosphor layer 8. In the same manner as described above, a portion of this light reaching the high density phosphor layer 8 can be simply radiated out through the light exit surface 10 of the high density phosphor layer 8, whereas the remaining portion can undergo wavelength conversion through the action of the phosphor 5 in the high density phosphor layer 8, before being radiated out through the light exit surface 10 of the high density phosphor layer 8.

Because the light radiated from the semiconductor light emitting element 4 can follow two separate optical paths, the amount of light emitted from the semiconductor light emitting element 4 is the aggregate of the amount of light following each of these two optical paths. This results in a bright semiconductor light emitting device with a high level of light extraction efficiency.

Furthermore, the light radiated from the light exit surface 10 of the high density phosphor layer 8 can also be a combination of light emitted by the semiconductor light emitting element 4 and light that has been emitted by the semiconductor light emitting element 4 and which has then undergone wavelength conversion by the phosphor 5. Visually, the light is seen as the color generated by additive color mixing of these two types of light.

The high density phosphor layer 8 formed near the central portion 12 of the dispersed phosphor-containing resin 6 can be formed by the heavier phosphor 5 sinking through the resin during inversion of the casing 1. Within the peripheral portion 13 of the high density phosphor layer 8, the phosphor 5 can accumulate along the substantially vertical inner peripheral surface of the second cavity 24. Accordingly, the high density phosphor layer 8 can be formed with a substantially uniform thickness across both the peripheral portion 13 and the central portion 12. As a result, the optical path length from the point of entering the high density phosphor layer 8, until reaching the light exit surface 10 of the high density phosphor layer 8, can be substantially equal across the entire surface. This means that the percentage ratio of light entering the high density phosphor layer 8 that will undergo wavelength conversion by the phosphor 5 can be substantially equal regardless of radiation direction. Namely, the incident light at a certain ratio can be equally subjected to the wavelength conversion by the phosphor layer 8 at any location where the light enters. This enables the production of a semiconductor light emitting device in which the problems of color irregularity and brightness fluctuation can be reduced and the overall quality of the device can be significantly improved.

Furthermore, because the high density phosphor layer 8 that forms the light exit surface 10 through which the light is externally radiated is formed with a three dimensional convex shape, the color and brightness of the light can be almost independent of the radiation direction.

In addition, the low density phosphor layer 9 that forms the interface with a light exit surface 11 of the semiconductor light emitting element 4 can be formed from a light transmitting resin that contains either a relatively low density of the phosphor 5 or almost no phosphor 5. This light transmitting resin can be a material with a similar refractive index to the semiconductor material of the light exit surface 11 of the semiconductor light emitting element 4. This enables the proportion of light that is emitted from the semiconductor light emitting element 4 and which then undergoes total reflection back inside the semiconductor light emitting element 4 at the light exit surface 11 to be minimized. As a result, it is possible for the vast majority of light to pass from the light exit surface 11 of the semiconductor light emitting element 4 into the low density phosphor layer 9. Thus, the light extraction efficiency from the semiconductor light emitting element 4 can be maximized.

Next is a description of some of the items that are common to the above-referenced exemplary embodiments.

First is a description of one of the purposes of sealing with a light transmitting resin. Bonding wires (not shown in the figures), which act as one example of the connection means for electrically connecting the anode and cathode electrodes of the semiconductor light emitting element with externally located terminal electrodes that are connected to a power source, can also be sealed by the light transmitting resin during the above-described manufacturing process. This light transmitting resin protects the semiconductor light emitting element and the bonding wires from mechanical stress such as vibration or impact, and from other external environmental factors such as moisture, gases, and dust. The member that forms the interface with the light exit surface of the semiconductor light emitting element (namely, the light transmitting resin that is used as the sealing material) can be formed from a material with a refractive index that is either similar to, or larger than, that of the semiconductor material of the light exit surface of the semiconductor light emitting element. This enables the proportion of light that is emitted from the semiconductor light emitting element and which then undergoes total reflection back inside the semiconductor light emitting element at the light exit surface to be minimized. As a result, the vast majority of light can pass through the interface into the other member, meaning that the light extraction efficiency from the semiconductor light emitting element can be maximized.

Next is a description of some of the purposes for forming the high density phosphor layer near the light exit surface where the light from the semiconductor light emitting device is radiated externally. One purpose is to enable the production of a semiconductor light emitting device that enables uniform scattering and refraction, and minimal color irregularity and brightness fluctuation, of the externally radiated light which is emitted from the semiconductor light emitting element and which then either passes directly out of the device, or undergoes wavelength conversion prior to exiting the device. Another purpose is to maximize the light extraction efficiency for light that has undergone wavelength conversion by the phosphor.

In other words, the high density phosphor layer can be formed near the light exit surface, and if viewed microscopically, the light exit surface may be seen to be formed with considerable unevenness due to the presence of the phosphor. Accordingly, the light from the semiconductor light emitting element which reaches the light exit surface either directly or following wavelength conversion by the phosphor can undergo scattering and refraction in all directions, with minimal bias, as a result of this light exit surface. Furthermore, light that undergoes wavelength conversion under the action of the phosphor that forms the convex portion of the light exit surface should pass through very little material (except for the resin film covering the phosphor) prior to being externally radiated, meaning very little of this light undergoes total reflection or refraction. That is, this construction can provide favorable light extraction efficiency.

Some of the effects of a semiconductor light emitting device according to various exemplary embodiments of the disclosed subject matter are described below.

(1) The semiconductor light emitting element and the bonding wires can be completely sealed with a light transmitting resin with a refractive index close to that of the semiconductor material that forms the exit surface of the semiconductor light emitting element. This light transmitting resin protects the semiconductor light emitting element and the bonding wires from mechanical stress such as vibration or impact, and from other external environmental factors such as moisture, gases, and dust. Furthermore, by using a resin with this type of similar refractive index, the proportion of light that is emitted from the semiconductor light emitting element and which then undergoes total reflection back inside the semiconductor light emitting element at the light exit surface can be minimized. As a result, the vast majority of light can pass from the light exit surface of the semiconductor light emitting element into the light transmitting resin on the other side of the interface, meaning the light extraction efficiency from the semiconductor light emitting element can be maximized.

(2) The cavity can be overfilled with the dispersed phosphor-containing resin, so that the resin bulges up in a convex shape above the uppermost surface of the cavity, and the structure is then inverted and cured. This can cause the heavier phosphor to sink down through the dispersed phosphor-containing resin within the inverted cavity and to accumulate near the surface of the convex bulge, thus forming a high density phosphor layer. As a result, the high density phosphor layer can be formed with a substantially uniform thickness across the entire surface, enabling the formation of a light source with minimal color irregularity and brightness fluctuation.

(3) The technique described in (2) above can be used to form a high density phosphor layer near the surface of the dispersed phosphor-containing resin, meaning that the high density phosphor layer 8 that constitutes the light exit surface through which the light is radiated externally can be formed in a three dimensional arch shape. As a result, the color and brightness of the light can be almost independent of the radiation direction.

(4) The high density phosphor layer can be formed near the light exit surface, and if viewed microscopically, the surface may be seen to be formed with considerable unevenness due to the presence of the phosphor. Accordingly, the light from the semiconductor light emitting element, which reaches the light exit surface either directly or following wavelength conversion by the phosphor, undergoes scattering and refraction in all directions, with minimal bias, as a result of this light exit surface. Furthermore, light that undergoes wavelength conversion under the action of the phosphor that forms the convex portion of the light exit surface should pass through very little material (except for the resin film covering the phosphor) prior to being radiated externally, meaning very little of this light undergoes total reflection or refraction. That is, this construction provides favorable light extraction efficiency.

(5) A second cavity in which the inner peripheral surface is substantially vertical can be formed above a mortar-shape first cavity. As a result, when the structure is inverted and cured, the phosphor within the peripheral portion of the high density phosphor layer can accumulate along this vertical inner peripheral surface of the second cavity. This means the high density phosphor layer can be formed with a substantially uniform thickness across both the peripheral portion and the central portion. This type of construction is particularly useful when a dispersed phosphor-containing resin is used that displays a large reduction in viscosity on heat curing.

(6) The filling of the cavity with the dispersed phosphor-containing resin can be completed in a single action. Furthermore, the type of lid that has conventionally been required to prevent resin leakage when the dispersed phosphor-containing resin is inverted and cured may not be necessary. As a result, an increase in labor or manufacturing means are typically not required, enabling suppression of increases in manufacturing costs.

(7) The high density phosphor layer can be formed in a substantially uniform manner across the entire surface of the resin and near the light exit surface through which light is externally emitted from the semiconductor light emitting device. This means light emitted from the semiconductor light emitting element may not be emitted through only certain concentrated regions. Accordingly, even if the emitted light directly enters a person's eyes, it presents almost no potential danger, so that the construction represents a people-friendly light source.

While there has been described what are at present considered to be embodiments of the invention, it will be understood that various modifications may be made thereto, and it is intended that the appended claims cover all such modifications as fall within the true spirit and scope of the invention.

What is claimed is:

1. A method of manufacturing a semiconductor light emitting device, comprising:

providing a casing having a concave-shaped cavity with an opening and a bottom portion;

installing a semiconductor light emitting element adjacent to the bottom portion of the cavity, the semiconductor light emitting element having a central light radiation direction directed forward along an optical axis of the light emitting device;

filling an interior of the cavity with a light transmitting resin containing a wavelength conversion material such that the resin forms into a convex shape in the light radiation direction of the light emitting element;

inverting the casing, so that self-weight causes the wavelength conversion material to separate into a high density portion and a low density portion within the resin; and curing the light transmitting resin in a state such that the wavelength conversion material exists in the high and low density portions, so as to form a resin layer located in an interior portion of the cavity, the resin layer including a first layer with the high density portion of the wavelength conversion material located near a surface of the convex shape and a second layer located adjacent the first layer with the low density portion of the wavelength conversion material, wherein the second layer is located in the light radiation direction of the semiconductor light emitting element and between the first layer and the semiconductor light emitting element in the light radiation direction of the semiconductor light emitting element such that the optical axis of the device extends from the semiconductor light emitting element and intersects both the first layer and second layer, wherein the cavity is composed of a first cavity and a second cavity, the first cavity having a truncated cone-shaped inner peripheral surface that opens outward along the light radiation direction of the light emitting element, the second cavity being positioned above the first cavity and having a substantially circular cylindrically shaped inner peripheral surface that is a continuous extension of the truncated cone-shaped inner peripheral surface and containing a common virtual surface with the first cavity;

at least one of the truncated cone-shaped inner peripheral surface and the substantially circular cylindrically shaped inner peripheral surface includes a reflective surface; and accumulating the wavelength conversion material within a peripheral portion of the first layer along the substantially circular cylindrically shaped inner peripheral surface of the second cavity.

2. The method of manufacturing a semiconductor light emitting device according to claim 1, wherein filling an interior of the cavity includes filling the entire cavity with light transmitting resin.

3. The method of manufacturing a semiconductor light emitting device according to claim 1, wherein curing includes forming the first layer with a substantially uniform thickness along a substantially entire extent of the first layer such that when light is emitted from the light emitting element the light travels in a direction through and substantially parallel with the substantially uniform thickness of the first layer along a substantial portion of the entire extent of the first layer.

* * * * *